(12) United States Patent
Kagohashi et al.

(10) Patent No.: US 12,484,159 B2
(45) Date of Patent: Nov. 25, 2025

(54) WIRING SUBSTRATE AND METHOD FOR MANUFACTURING THE SAME

(71) Applicant: IBIDEN CO., LTD., Gifu (JP)

(72) Inventors: Susumu Kagohashi, Ogaki (JP); Jun Sakai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 189 days.

(21) Appl. No.: 18/519,524

(22) Filed: Nov. 27, 2023

(65) Prior Publication Data

US 2024/0179853 A1 May 30, 2024

(30) Foreign Application Priority Data

Nov. 28, 2022 (JP) ................. 2022-188921

(51) Int. Cl.
*H05K 3/46* (2006.01)
*H05K 1/03* (2006.01)
*H05K 3/10* (2006.01)
*H05K 3/42* (2006.01)

(52) U.S. Cl.
CPC ......... *H05K 3/4605* (2013.01); *H05K 1/0306* (2013.01); *H05K 3/108* (2013.01); *H05K 3/423* (2013.01)

(58) Field of Classification Search
CPC ......... H05K 3/4605; H05K 2201/0209; H05K 3/388; H05K 3/0011
See application file for complete search history.

(56) References Cited

U.S. PATENT DOCUMENTS

2012/0161323 A1* 6/2012 Kim ............... H01L 23/498
                                                    438/654
2023/0069980 A1* 3/2023 Ikeda ................ H05K 3/4661

FOREIGN PATENT DOCUMENTS

JP          2022-030289 A     2/2022

* cited by examiner

*Primary Examiner* — Sherman Ng
(74) *Attorney, Agent, or Firm* — Finnegan, Henderson, Farabow, Garrett & Dunner, LLP

(57) ABSTRACT

A wiring substrate includes an insulating layer including inorganic particles and resin, a seed layer formed on a surface of the insulating layer, and a conductor layer including a conductor pattern and formed on the seed layer. The surface of the insulating layer is a roughened surface formed such that the roughened surface of the insulating layer has exposed portions of the inorganic particles and resin with gaps at interfaces where the inorganic particles and the resin are in contact, and the seed layer is formed on the roughened surface of the insulating layer such that the seed layer is formed along the exposed portions of the inorganic particles and resin exposed on the roughened surface of the insulating layer and is not formed in the gaps at the interfaces where the inorganic particles and the resin are in contact.

20 Claims, 3 Drawing Sheets

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2022-188921, filed Nov. 28, 2022, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2022-30289 describes a wiring substrate that includes an insulating layer formed from inorganic particles and a resin, a seed layer formed on the insulating layer, and a conductor layer formed on the seed layer. The entire contents of this publication are incorporated herein by reference.

SUMMARY OF THE INVENTION

According to one aspect of the present invention, a wiring substrate includes an insulating layer including inorganic particles and resin, a seed layer formed on a surface of the insulating layer, and a conductor layer including a conductor pattern and formed on the seed layer. The surface of the insulating layer is a roughened surface formed such that the roughened surface of the insulating layer has exposed portions of the inorganic particles and resin with gaps at interfaces where the inorganic particles and the resin are in contact, and the seed layer is formed on the roughened surface of the insulating layer such that the seed layer is formed along the exposed portions of the inorganic particles and resin exposed on the roughened surface of the insulating layer and is not formed in the gaps at the interfaces where the inorganic particles and the resin are in contact.

According to another aspect of the present invention, a method for manufacturing a wiring substrate includes forming an insulating layer including inorganic particles and resin, roughening a surface of the insulating layer such that the surface of the insulating layer has a roughened surface and that the roughened surface has exposed portions of the inorganic particles and resin with gaps at interfaces where the inorganic particles and the resin are in contact, forming a seed layer on the roughened surface of the insulating layer such that the seed layer is formed along the exposed portions of the inorganic particles and resin exposed on the roughened surface of the insulating layer and is not formed in the gaps at the interfaces where the inorganic particles and the resin are in contact, and forming a conductor layer on the seed layer such that the conductor layer has a conductor pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
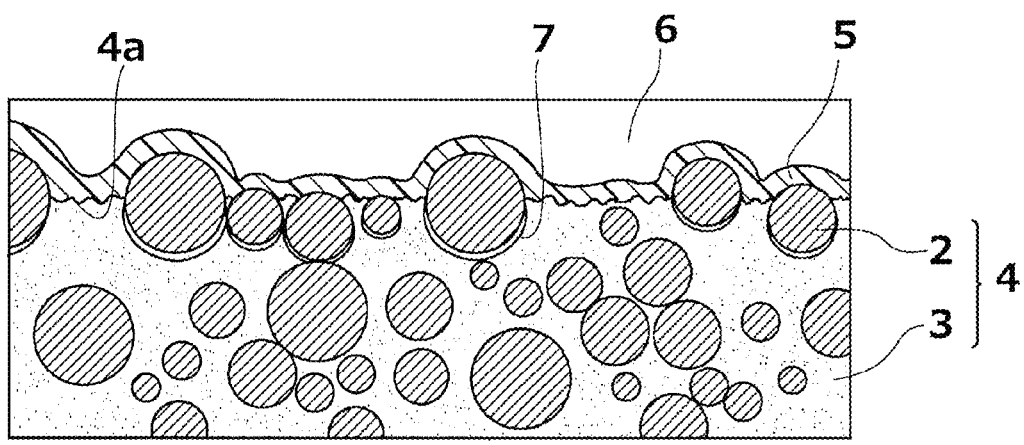
FIG. 1 is a cross-sectional view schematically illustrating a wiring substrate according to an embodiment of the present invention.

Embodiments will now be described with reference to the accompanying drawings, wherein like reference numerals designate corresponding or identical elements throughout the various drawings.

Wiring Substrate

A wiring substrate according to an embodiment of the present invention is described below with reference to the drawings.

FIG. 1 is a cross-sectional view schematically illustrating a wiring substrate according to an embodiment of the present invention. In FIG. 1, a wiring substrate 1 includes an insulating layer 4 containing multiple inorganic particles 2 and a resin 3, a seed layer 5 formed on a surface (4a) of the insulating layer 4, and a conductor layer 6 of a predetermined conductor pattern formed on the seed layer 5. It is also possible to form a build-up substrate by stacking multiple wiring substrates 1 each having the above-described structure.

In a wiring substrate 1 according to an embodiment of the present invention, the inorganic particles 2 and the resin 3 are exposed on the surface (4a) of the insulating layer 4 with gaps 7 at the interfaces where the inorganic particles 2 and the resin 3 are in contact, a surface of the resin 3 (a portion of the surface (4a)) is roughened to become a rough surface, the seed layer 5 is not formed in the gaps 7 between the inorganic particles 2 and the resin 3, and it is formed along the inorganic particles 2 and the resin 3 exposed on the surface (4a) of the insulating layer 4. The roughened surface of the resin 3 preferably has a surface roughness of 0.05 micron or more and 0.2 micron or less Further, the seed layer 5 is preferably a sputtering film. Further, it is preferable that the seed layer 5 is a sputtering film and includes a first layer, which is formed of a copper alloy, and a second layer, which is formed on the first layer and is formed of copper.

According to the wiring substrate 1 described above, the seed layer 5 is not formed in the gaps 7 between the inorganic particles 2 and the resin 3 and is formed along the inorganic particles 2 and the resin 3 exposed on the surface (4a) of the insulating layer 4. Therefore, it is possible to prevent a short circuit between conductor patterns caused by the seed layer 5 remaining between the inorganic particles 2 and the resin 3 without being completely removed by etching during a formation process of the conductor patterns. Further, since the inorganic particles 3 exposed on the surface (4a) of the insulating layer 4 have an anchor effect, adhesion strength between the insulating layer 4 and the seed layer 5 is maintained.

Method for Manufacturing Wiring Substrate

In a method for manufacturing a wiring substrate according to an embodiment of the present invention, the surface (4a) of the insulating layer 4 are roughened, and by sputtering on the roughened surface (4a) of the insulating layer 4, the seed layer 5 is formed along the inorganic particles 2 and the resin 3 exposed on the surface (4a) of the insulating layer 4 without being formed in the gaps 7 between the inorganic particles 2 and the resin 3. In the following, with reference to FIGS. 2A-2D, processes of a method for manufacturing a wiring substrate according to an embodiment of the present invention are described.

Figure 2A:
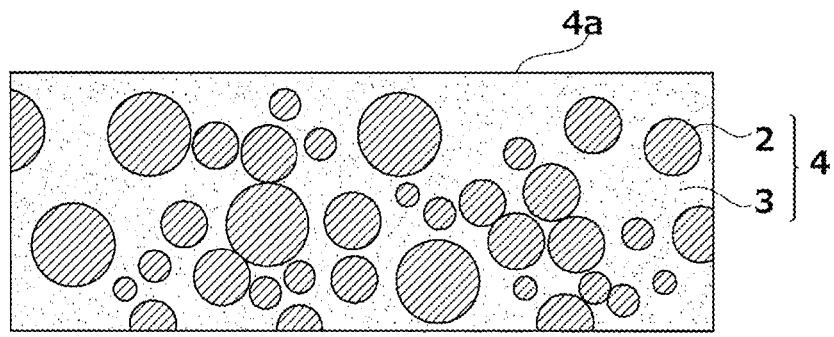
FIGS. 2A-2D are each a cross-sectional view schematically illustrating processes of a method for manufacturing a wiring substrate according to an embodiment of the present invention.

First, as illustrated in FIG. 2A, the insulating layer 4 containing the multiple inorganic particles 2 and the resin 3 is formed. In the formation of the insulating layer 4, for example, a film-like resin 3 containing multiple inorganic particles 2 in a resin such as an epoxy resin is used. By using such a film-like resin 3, the insulating layer 4 containing the multiple inorganic particles 2 and the resin 3 is formed.

Figure 2B:
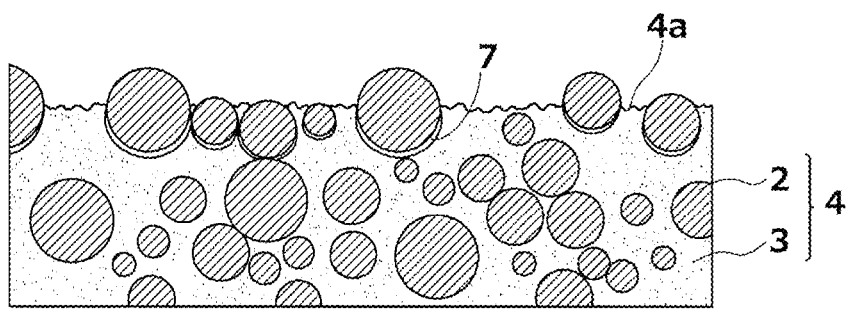

Next, as illustrated in FIG. 2B, the surface (4a) of the insulating layer 4 is roughened, and the inorganic particles 2 and the resin 3 are exposed on the surface (4a) of the insulating layer 4 with gaps 7 at the interfaces where the inorganic particles 2 and the resin 3 are in contact. The surface (4a) of insulating layer 4 is treated, for example, with a potassium permanganate solution treatment. In this case, the roughening is preferably performed such that a surface roughness of a rough surface of the resin 3, which forms a part of the surface (4a), is 0.05 microns or more and 0.2 microns or less.

Figure 2C:
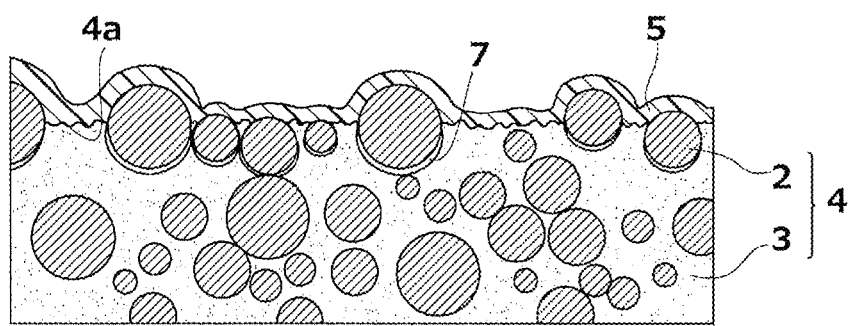

Next, as illustrated in FIG. 2C, by sputtering on the roughened surface (4a) of the insulating layer 4, the seed layer 5 is formed along the inorganic particles 2 and the resin 3 exposed on the surface (4a) of insulating layer 4 without being formed in the gaps 7 between the inorganic particles 2 and the resin 3. Here, the seed layer 5 is formed by sputtering. As a result, compared to a conventional case of forming the seed layer 5 by electroless plating, even when there are some gaps 7 at interfaces where the inorganic particles 2 and resin 3 exposed on the surface (4a) of the insulating layer 4 contact each other, the seed layer 5 is formed along the inorganic particles 2 and the resin 3 exposed on the surface (4a) of the insulating layer 4.

Figure 2D:
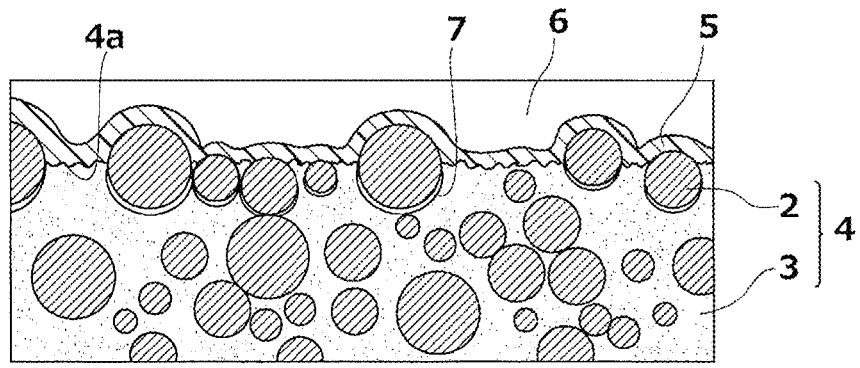

Next, as illustrated in FIG. 2D, on the seed layer 5 formed by sputtering, the conductor layer 6 is formed. The conductor layer 6 is formed, for example, by electrolytic plating using copper. Further, the conductor layer 6 is patterned using a resist and quick etching.

According to the method for manufacturing the wiring substrate described above, after the surface (4a) of the insulating layer 4 is roughened, the seed layer 5 is formed by sputtering. Particles forming the seed layer 5 collide perpendicularly with the surface (4a) of insulating layer 4. Therefore, adhesion strength between the surface (4a) and the seed layer 5 is high. Further, it is formed along the inorganic particles 2 and the resin 3 exposed on the surface (4a) of the insulating layer 4.

Japanese Patent Application Laid-Open Publication No. 2022-30289 describes a wiring substrate that includes an insulating layer formed from inorganic particles and a resin, a seed layer formed on the insulating layer, and a conductor layer formed on the seed layer. Some of the inorganic particles are separated from the resin, and a part of the seed layer is formed between the inorganic particles and the resin.

Figure 3:
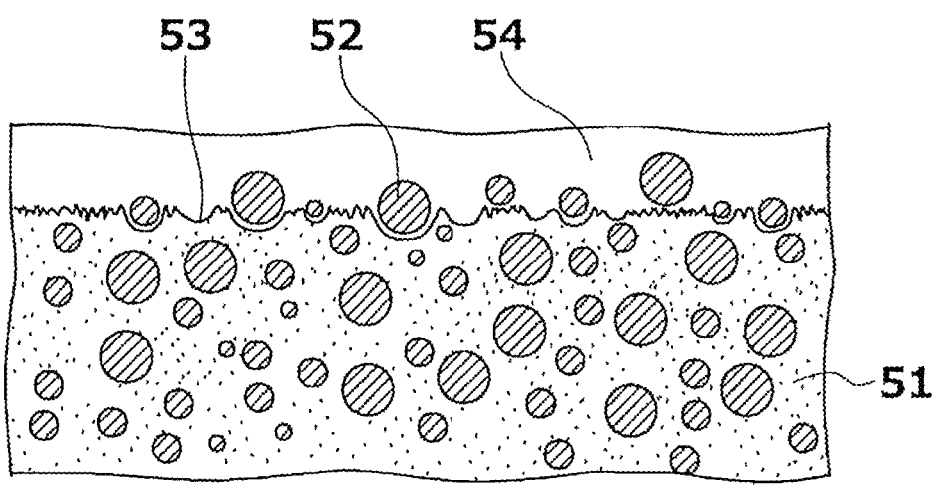
FIG. 3 is a cross-sectional view schematically illustrating an example of a conventional wiring substrate.

According to a technology described in Japanese Patent Application Laid-Open Publication No. 2022-30289, adhesion strength between an insulating layer and a conductor layer may increase via a seed layer. On the other hand, as illustrated in FIG. 3, a part of a seed layer 54 is formed between inorganic particles 52 and a resin 53 exposed on a surface (51a) of an insulating layer 51. That is, the seed layer 54 remains between the inorganic particles 52 and the resin 53 and is not completely removed by etching during a formation process of conductor patterns. Therefore, a short circuit may occur between the conductor patterns.

A wiring substrate according to an embodiment of the present invention includes an insulating layer that contains multiple inorganic particles and a resin, a seed layer that is formed on a surface of the insulating layer, and a conductor layer that has a predetermined conductor pattern and is formed on the seed layer. The inorganic particles and the resin are exposed on the surface of the insulating layer with gaps at the interfaces where the inorganic particles and the resin are in contact. A surface of the resin is a roughened surface. The seed layer is formed along the inorganic particles and the resin exposed on the surface of the insulating layer without being formed in the gaps between the inorganic particles and the resin.

A method for manufacturing a wiring substrate according to an embodiment of the present invention includes forming an insulating layer that contains multiple inorganic particles and a resin; roughening a surface of the insulating layer such that the inorganic particles and the resin are exposed on the surface of the insulating layer with gaps at the interfaces where the inorganic particles and the resin are in contact and that the surface of the insulating layer has a rough surface, forming a seed layer along the inorganic particles and the resin exposed on the surface of the insulating layer without forming the seed layer in the gaps between the inorganic particles and the resin, by sputtering on the roughened surface of the insulating layer, and forming a conductor layer on the seed layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
   an insulating layer comprising inorganic particles and resin;
   a seed layer formed on a surface of the insulating layer; and
   a conductor layer comprising a conductor pattern and formed on the seed layer,
   wherein the surface of the insulating layer is a roughened surface formed such that the roughened surface of the insulating layer has exposed portions of the inorganic particles and resin with gaps at interfaces where the inorganic particles and the resin are in contact, and the seed layer is formed on the roughened surface of the insulating layer such that the seed layer is formed along the exposed portions of the inorganic particles and resin exposed on the roughened surface of the insulating layer and is not formed in the gaps at the interfaces where the inorganic particles and the resin are in contact.

2. The wiring substrate according to claim 1, wherein the insulating layer is formed such that the roughened surface has a surface roughness in a range of 0.05 micron to 0.2 micron.

3. The wiring substrate according to claim 1, wherein the seed layer is a sputtering film.

4. The wiring substrate according to claim 1, wherein the seed layer is a sputtering film and includes a first layer comprising a copper alloy, and a second layer formed on the first layer and comprising copper.

5. The wiring substrate according to claim 2, wherein the seed layer is a sputtering film.

6. The wiring substrate according to claim 2, wherein the seed layer is a sputtering film and includes a first layer comprising a copper alloy, and a second layer formed on the first layer and comprising copper.

7. The wiring substrate according to claim 1, wherein the seed layer includes a first layer comprising a copper alloy, and a second layer formed on the first layer and comprising copper.

8. The wiring substrate according to claim 2, wherein the seed layer includes a first layer comprising a copper alloy, and a second layer formed on the first layer and comprising copper.

9. The wiring substrate according to claim 1, wherein the seed layer includes copper.

10. The wiring substrate according to claim 2, wherein the seed layer includes copper.

11. The wiring substrate according to claim 1, wherein the conductor layer comprises an electrolytic plating layer.

12. The wiring substrate according to claim 2, wherein the conductor layer comprises an electrolytic plating layer.

13. The wiring substrate according to claim 3, wherein the conductor layer comprises an electrolytic plating layer.

14. The wiring substrate according to claim 4, wherein the conductor layer comprises an electrolytic plating layer.

15. A method for manufacturing a wiring substrate, comprising:

forming an insulating layer comprising inorganic particles and resin;

roughening a surface of the insulating layer such that the surface of the insulating layer has a roughened surface and that the roughened surface has exposed portions of the inorganic particles and resin with gaps at interfaces where the inorganic particles and the resin are in contact;

forming a seed layer on the roughened surface of the insulating layer such that the seed layer is formed along the exposed portions of the inorganic particles and resin exposed on the roughened surface of the insulating layer and is not formed in the gaps at the interfaces where the inorganic particles and the resin are in contact; and forming a conductor layer on the seed layer such that the conductor layer has a conductor pattern.

16. The method of claim 15, wherein the roughening of the insulating layer includes roughening the surface of the insulating layer such that the exposed portion of the resin has a surface roughness in a range of 0.05 micron to 0.2 micron.

17. The method of claim 15, wherein the forming of the seed layer includes forming a first layer comprising a copper alloy and forming a second layer comprising copper on the first layer.

18. The method of claim 15, wherein the seed layer is formed by sputtering.

19. The method of claim 16, wherein the seed layer is formed by sputtering.

20. The method of claim 17, wherein the seed layer is formed by sputtering.

* * * * *